United States Patent [19]

Hamakawa et al.

[11] Patent Number: 5,995,692
[45] Date of Patent: Nov. 30, 1999

[54] LIGHT EMITTING DEVICE MODULE

[75] Inventors: Atsushi Hamakawa; Takashi Kato; Michio Murata; Hidetoshi Kobayashi, all of Yokohama, Japan

[73] Assignee: Sumitomo Electric Industries, Ltd., Osaka, Japan

[21] Appl. No.: 08/877,821

[22] Filed: Jun. 18, 1997

[30]     Foreign Application Priority Data

Jun. 19, 1996  [JP]  Japan ................................... 8-158464

[51] Int. Cl.⁶ ............................... H01S 3/08; G02B 6/30
[52] U.S. Cl. ............................... 385/49; 372/92; 372/102
[58] Field of Search .................................. 372/6, 43, 49, 372/50, 92, 102; 385/37, 49, 88; 438/29

[56]             References Cited

U.S. PATENT DOCUMENTS 5,699,377  12/1997  Pan ............................................. 372/92

FOREIGN PATENT DOCUMENTS

86/01303  2/1986  WIPO .................................. 385/37 X

OTHER PUBLICATIONS

Lin, "Superluminescent Diodes with Angled Facet Etched by Chemically Assisted Ion Beam Etching", Electronics Letters, vol. 27, No. 11, pp. 968–970, May 1991.

Lin, "The Influence of Facet Roughness on the Reflectivities of Etched–Angled Facets for Superluminescent Diodes and Optical Amplifiers", IEEE Photonics Technology Letters, vol. 4, No. 2, pp. 127–129, Feb. 1992.

Collar et al, "Low Residual Reflectivity of Angled–Facet Semiconductor Laser Amplifiers", IEEE Photonics Technology Letters, vol. 2, No. 8, SEI 97–11, A1, Aug. 1990, pp. 553–555.

Nakano et al, "Fabrication and Characteristics of an Integrated DFB Laser/Amplifier Having Reactive–Ion–Etched Tilted End Facets", Japanese Journal of Applied Physics, vol. 29, No. 12, SEI 97–11, Dec. 1990, pp. 2430–2433.

Campbell et al, "A Wavelength Stable Uncooled Laser for Access Networks", 21st Eur. Cont. on Opt. Comm. (ECOC'95–Brussels) A2, pp. 545–548, (1995).

*Primary Examiner*—John D. Lee
*Assistant Examiner*—Victoria D. Hao
*Attorney, Agent, or Firm*—Pillsbury Madison & Sutro LLP

[57]            ABSTRACT

The present invention relates to a light emitting device module which can easily be made and can yield a stable output characteristic, and a method of making the same. The light emitting device module in according to the present invention comprises a semiconductor device in which an active region having a light exit facet and a light reflecting facet with a lower light reflectivity than the light exit facet respectively at both ends is fabricated along a predetermined reference axis, and an optical fiber having a grating provided along the longitudinal direction of the core region and an end facet arranged so as to face the light exit facet. In particular, in the light emitting device module according to the present invention, the light exit facet of the active region is inclined with respect to the light reflecting facet of the active region by a predetermined angle, thereby the light reflecting facet of the active region and the grating constitute an external cavity through the light exit facet.

9 Claims, 9 Drawing Sheets

EXTERNAL CAVITY

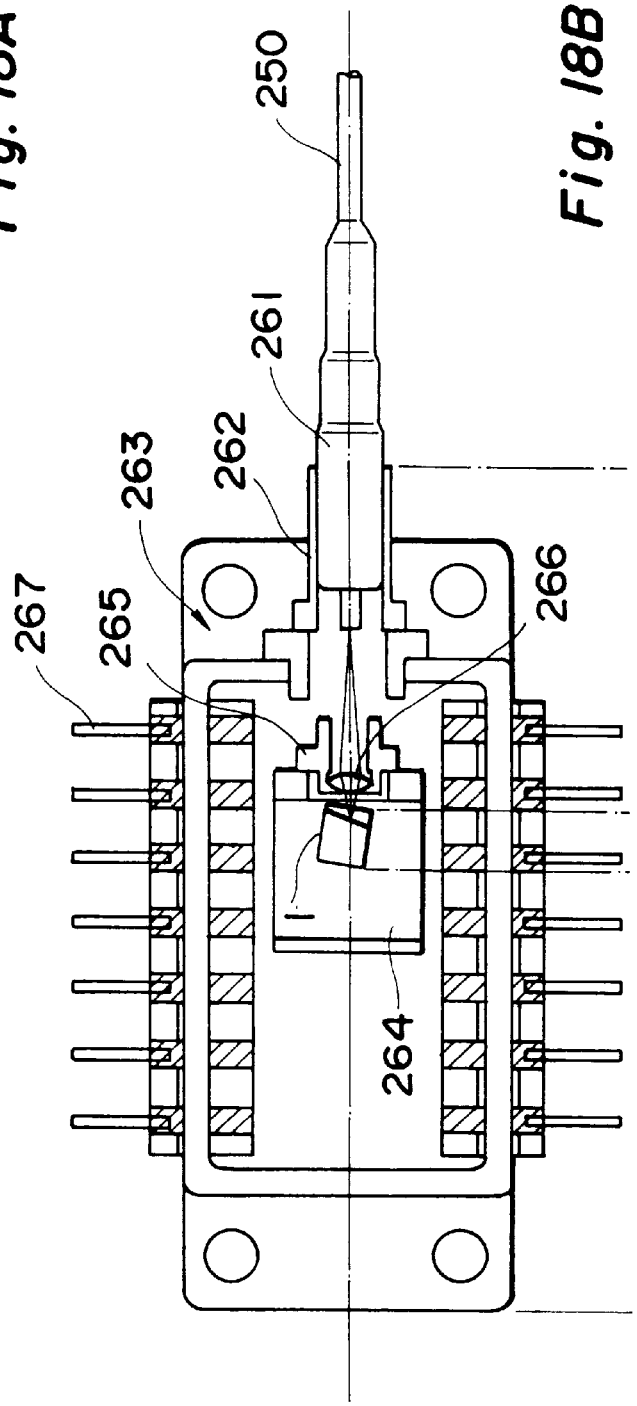
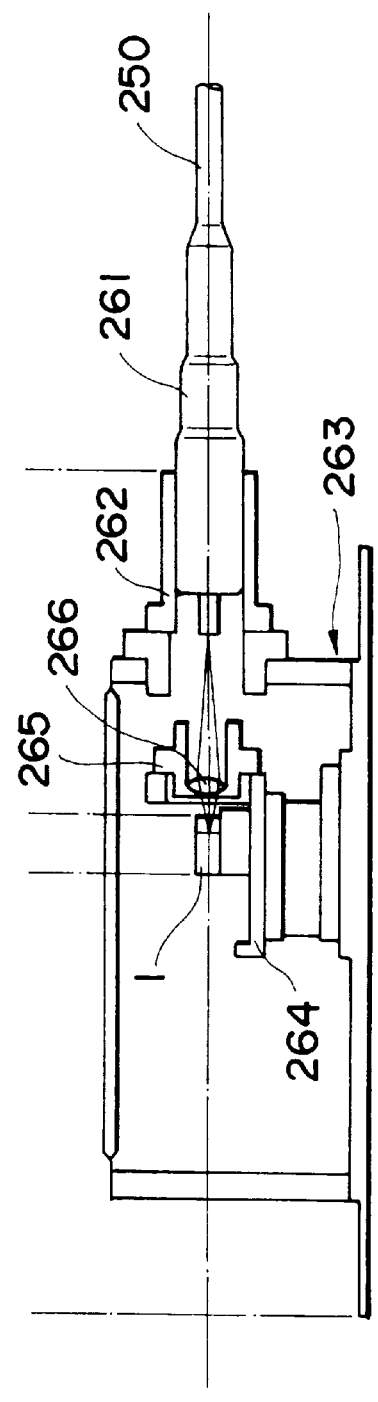
Fig. 18A
Fig. 18B

LIGHT EMITTING DEVICE MODULE

BACKGROUND OF THE INVENTION

1. Field of the Invention

The present invention relates to a light emitting device module including a semiconductor device such as a semiconductor laser amplifier (SLA), which outputs light having a predetermined wavelength, and a method of making the same.

2. Related Background Art

A known example of the conventional light emitting device module comprises, as shown in FIG. 1, a semiconductor laser amplifier (SLA) A, which serves as a light emitting source, and an optical fiber B with a grating, which is a waveguide. In the SLA A, an active layer D is formed between cladding layers C, whereas a light exit facet E and a light reflecting facet F are respectively arranged at both end facets of the active layer D. The light exit facet E has a low light reflectivity, and the light reflecting facet F has a high light reflectivity. The optical fiber B is arranged such that its end facet faces the light exit facet E of the SLA A. In its core G, a diffraction grating H is a region such that the refractive index periodically changes along the longitudinal direction of the core G. The diffraction grating H and the light reflecting facet F constitute a resonator for laser oscillation. Here, the optical fiber comprises a core having a predetermined refractive index and a cladding, provided around the outer periphery of the core, having a refractive index lower than that of the core, and a grating in the core. The grating reflects light with a predetermined wavelength (referred to as "reflection wavelength of the grating" hereinafter). A method of making the grating is disclosed, for example, in International Publication No. WO 86/01303. In such a light emitting device module, light is generated in the active layer D when an electric current is injected into the SLA A. This light travels to-and-fro between the light reflecting facet F and the diffraction grating H of the optical fiber B as being reflected, so as to be amplified, thereby a laser beam I having a single wavelength (reflection wavelength of the grating) determined by the pitch of the diffraction grating H is outputted through the optical fiber B.

SUMMARY OF THE INVENTION

Having studied the prior art mentioned above, the inventors have found the following problems to be overcome. Namely, in the conventional light emitting device module, due to its configuration, favorable characteristics may not be obtained in its laser beam output. Though the light reflectivity at the light exit facet E in the SLA A should ideally be zero, its lower limit in practice is on the order of $10^{-3}$, thereby slight residual reflection may occur on the light exit facet. Consequently, the light reflected thereby may travel to-and-fro within the SLA A so as to be amplified and, as a weak laser beam J, outputted through the optical fiber B. In this case, as shown in FIG. 2, the oscillation spectrum exhibited by the light emitting device module includes a main peak K determined by the pitch of the diffraction grating H and a number of sub-peaks L which are positioned on both sides thereof and generated due to resonance between the light reflecting facet F and the light exit facet E. In such a light emitting device module, as the electric current injected into the SLA A increases, though there is no wavelength fluctuation in the main peak K, the wavelengths of the sub-peaks L may fluctuate, thereby affecting the state of oscillation in the main peak K. Consequently, as shown in FIG. 3, kink (nonlinearity) may occur in the injected current vs. laser beam output characteristic, thereby failing to yield favorable characteristics.

Proposed means against such poor characteristics is to make the active layer D, which becomes a waveguide, in a bent form as shown in FIG. 4 (R. J. Campbell et al., *Proc. ECOC*' 95, We. A. 3.4, 545–548 (1995)). An SLA A1 shown in FIG. 4 is configured to prevent the light from resonating between the light reflecting facet F and the light exit facet E, so as to improve its characteristics. Also, as shown in FIG. 5, though not relating to a light emitting device module, it has been proposed to obliquely form a light entrance facet M and a light exit facet N with respect to the active layer D of a semiconductor device A2 for an optical amplifier (A. J. Collar et al., *Photonics Technology Letters*, vol. 2, no. 8 (1990)).

In the light emitting device module shown in FIG. 4, however, since the waveguide is bent, radiation loss and scattering loss become greater, the laser beam may not efficiently be outputted therefrom. Also, in order to fabricate a bent waveguide, a precise manufacture technique is required, thereby complicating the manufacturing process itself. Further, since the waveguide is bent, the resonator length becomes greater, thereby increasing the power consumption and, together therewith, the heating value. On the other hand, in the optical amplifier shown in FIG. 5, though the light entrance facet M and the light exit facet N opposing each other, each of them is obliquely formed with respect to the longitudinal direction in which the active layer D extends. It is difficult for these facets to function as a resonator of a light emitting device module. Accordingly, such a technique is unlikely to improve the output characteristic of laser beams.

An object of the present invention is to provide a light emitting device module which can easily be made and can yield a stable output characteristic, and a method of making the same.

The light emitting device module according to the present invention comprises, at least, a semiconductor device in which an active region (waveguide) having a light exit facet and a light reflecting facet with a light reflectivity (e.g., 80 to 90% or more) greater than the light reflectivity (e.g., 0.01% or less) of the light exit facet respectively at both ends is fabricated along a predetermined reference axis, and an optical fiber with a grating provided in a core region along its longitudinal direction and an end facet arranged so as to face the light exit facet. In particular, in the light emitting device module according to the present invention, the light exit facet of the active region is inclined with respect to the light reflecting facet of the active region by a predetermined angle, thereby the light reflecting facet of the active region and the grating constitute an external cavity through the light exit facet.

The optical fiber comprises a core region having a predetermined refractive index and a cladding, provided around the outer periphery of the core region, having a lower refractive index than the core region, and a grating in the core region. The refractive index of the grating periodically changes (photoinduced refractive index change occurs) and functions to reflect light having a predetermined wavelength (referred to as "reflection wavelength" of the grating hereinafter).

Specifically, in the light emitting device module in the present invention, the light reflecting facet of the active region is orthogonal to the reference axis of the active region (corresponding to the direction in which the active region extends). On the other hand, the light exit facet inclined with respect to the light reflecting facet by a predetermined angle is neither orthogonal to the reference axis of the active region nor in parallel to the light reflecting facet. Thus, the light exit facet is obliquely formed with respect to the directions in which the light propagating through the active region travels to-and-fro (corresponding to both the extending direction of the active region and the reference axis of the active region), and the light reflecting facet and the light exit facet are not in parallel to each other. Therefore, unnecessary light can be prevented from resonating between the light exit facet and the light reflecting facet.

Also, the light emitting device module according to the present invention may have a structure (see FIGS. 16, 18A and 18B) for holding the semiconductor device and the optical fiber with the grating at a predetermined position such that the optical axis of the optical fiber and the light exit facet of the active region in the semiconductor device intersect at a predetermined angle (including 90°). Preferably, this structure further comprises an optical system arranged in an optical path between the light exit facet of the active region in the semiconductor device and the end facet of the optical fiber opposing the light reflecting facet. The optical fiber may include a fiber (lensed fiber or rounded-end fiber) having a curved end facet opposing the light exit facet of the active region (see FIG. 17). Here, a specific optical system may be employed so as to realize a configuration in which the normal of the light exit facet of the active region coincides with the optical axis of the optical fiber.

Further, the light emitting device module according to the present invention preferably comprises a first film (including a multilayered film), covering the light exit facet of the active region in the semiconductor device, for reducing the light reflectivity of the light exit facet, and more preferably comprises a second film (including a multilayered film), covering the light reflecting facet of the active region in the semiconductor device, for increasing the light reflectivity of the light reflecting facet. In particular, when the semiconductor device is a semiconductor laser amplifier, it is preferred that the light exit facet of the active region have a light reflectivity lower than the light reflectivity of the light reflecting facet of the active region. In this configuration, the first film includes an anti-reflection coating such as a dielectric multilayered film, whereas the second film includes a high reflection coating such as a metal film.

In order to incline the light exit facet of the active region in the semiconductor device with respect to the light reflecting facet by a predetermined angle, at least one of the light exit facet and light reflecting facet is formed by dry-etching such as reactive ion etching (RIE), reactive ion beam etching (RIBE), radical etching, or concentrated ion etching. Accordingly, each of the light exit facet and light reflecting facet of the active region is either a dry-etched mirror surface or a cleavage plane.

In order to improve optical characteristics of the light emitting device module, at least thus obtained light exit facet (a mirror surface formed by dry-etching or a cleavage plane) is preferably coated with an anti-reflection coating (included in the first film) such as a dielectric multilayered film for lowering its light reflectivity, and thus obtained light reflecting facet (a mirror surface formed by dry-etching or a cleavage plane) is more preferably coated with a high reflection coating (second film) for increasing its light reflectivity.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIGS. 18A and 18B are cross-sectional views showing a specific configuration of the light emitting device module according to the present invention (third specific example), in which its structure for defining the positional relationship between the semiconductor device and the optical fiber with a grating is depicted in particular.

DETAILED DESCRIPTION OF THE PREFERRED EMBODIMENTS

Figure 1:
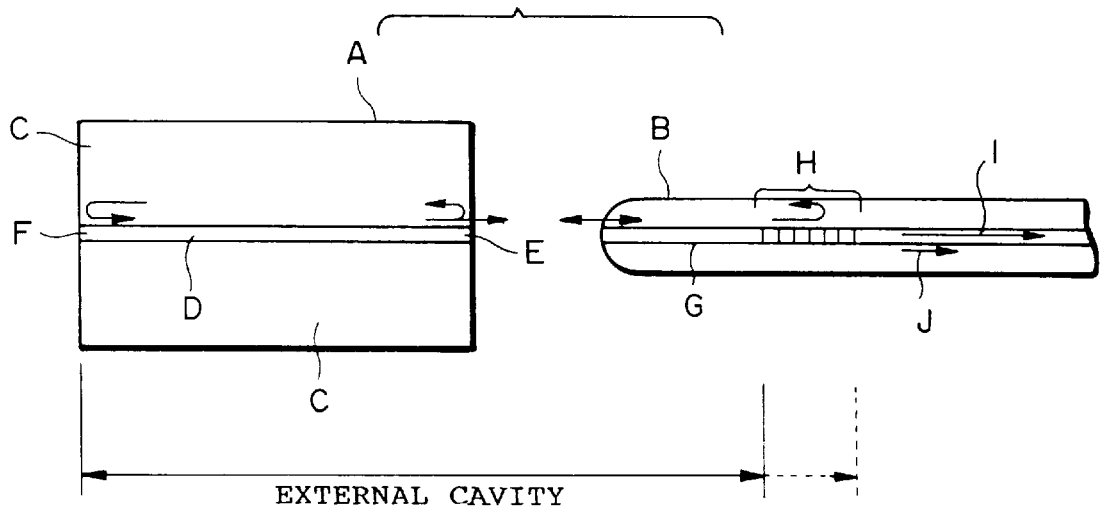
FIG. 1 is a view showing a schematic configuration of a conventional light emitting device module.
Figure 2:
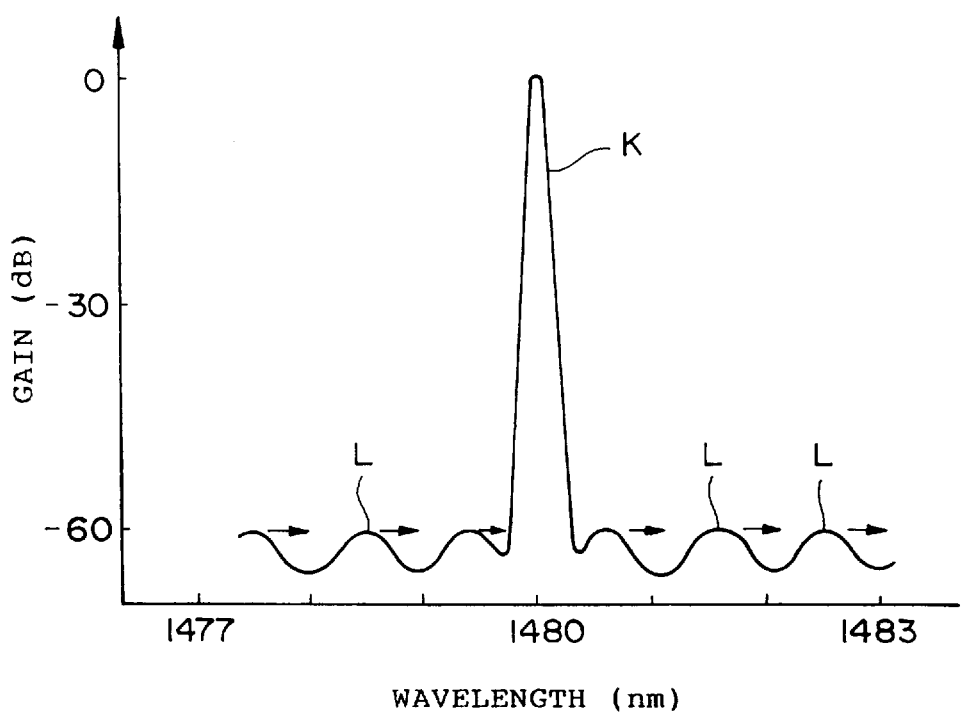
FIG. 2 a graph showing an oscillation spectrum in the conventional light emitting device module.

In the following, embodiments of the light emitting device module according to the present invention will be explained with reference to FIGS. 6 to 18B.

Among the drawings, constituents identical to each other will be referred to with marks identical to each other without their overlapping explanations repeated. Also, dimensional proportions in the drawings do not always coincide with those explained.

Figure 6:
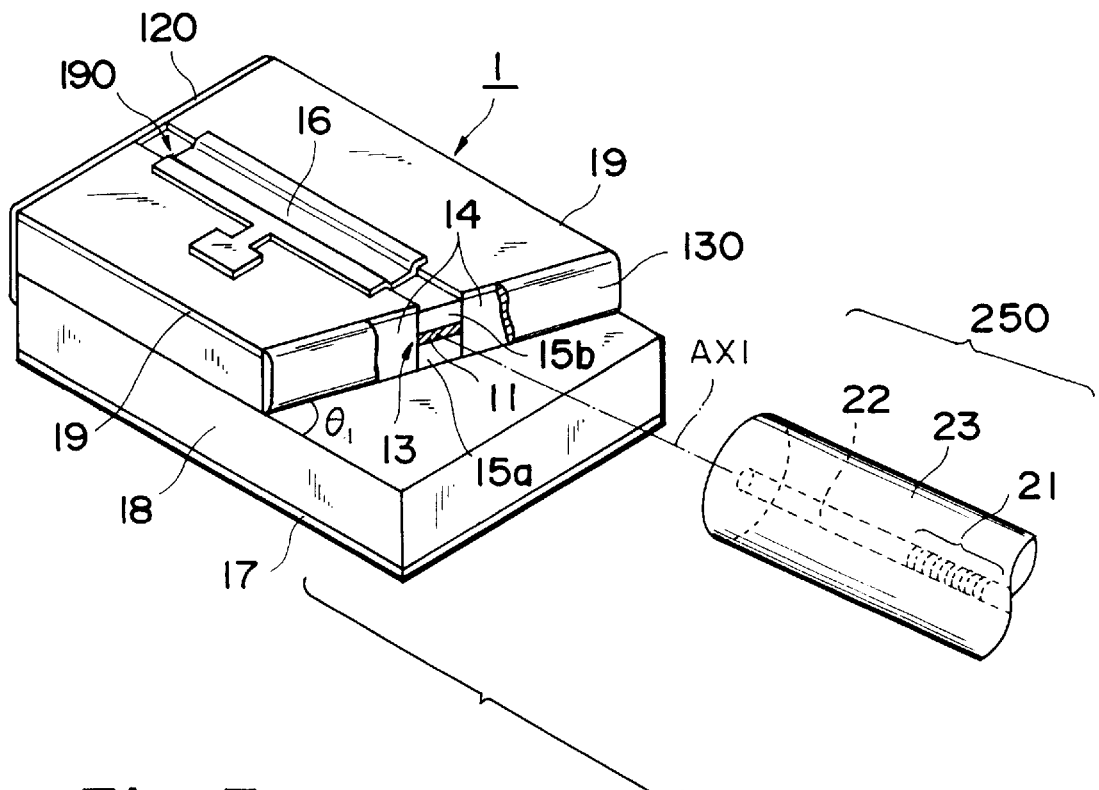
FIG. 6 is a perspective view showing a schematic configuration of the light emitting device module according to a first embodiment of the present invention.
Figure 7:
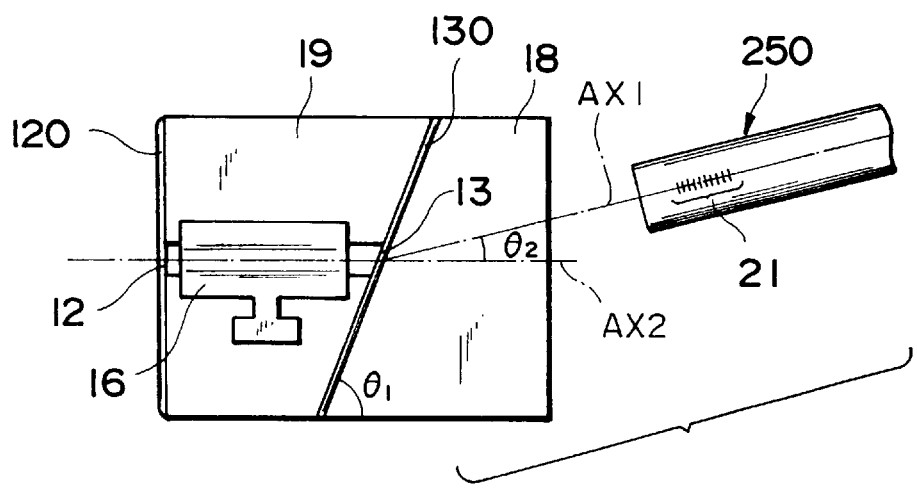
FIG. 7 is a plane view for explaining the positional relationship between the semiconductor device and the optical fiber with a grating in the light emitting device module according to the present invention.

FIGS. 6 and 7 are respectively perspective and plane views showing a schematic configuration of the light emitting device module according to a first embodiment of the present invention. As shown in FIG. 6, a semiconductor laser amplifier (SLA) 1 constitutes a light emitting device module when combined with an optical fiber 250 having a diffraction grating 21. Here, the optical fiber 250 comprises a core region 22 containing $GeO_2$, a cladding region 23, and a grating 21 provided in the core region 22. The SLA 1 has an active region 11 for generating and amplifying light, whereas a light reflecting facet 12 and a light exit facet 13 are respectively arranged at both ends of the active region 11. Employed as the SLA 1, for example, is a laser diode chip having a double hetero structure of InGaAsP/InP, in which, between buried layers 14 of InP on an InP substrate 18, a cladding layer 15a of InP, the active region 11 of InGaAsP, and a cladding layer 15b of InP are successively formed. When a mixed material is used as the active region 11 in this manner, it exhibits a higher refractive index with respect to the cladding layers 15 and the buried layers 14, thereby the light generated in the active region 11 propagates along the stripe of the active region 11. Here, without being restricted to the double hetero structure of InGaAsP/InP, the SLA 1 may have any structure made of any materials as long as the light exit facet 13 and the light reflecting facet 12 are respectively arranged at both ends of the active region 11.

The light reflecting facet 12 is positioned at one end facet of the active region 11 of the SLA 1. The light reflecting facet 12 utilizes a cleavage plane of the SLA 1 and is formed so as to be substantially orthogonal to the direction in which the active region 11 extends (corresponding to a reference axis AX2). Also, the light reflecting facet 12 has a high light reflectivity (e.g., 80 to 90% or more) so as to substantially reflect the light propagating through the active region 11. In order to obtain a very high light reflectivity for the light reflecting facet 12, a high reflecting film 120 may be attached to the surface thereof as shown in FIGS. 6 and 7. As the high reflecting film 120, a dielectric multilayered film or the like is used. Further, the film 120 preferably includes a high reflection coating.

Figure 3:
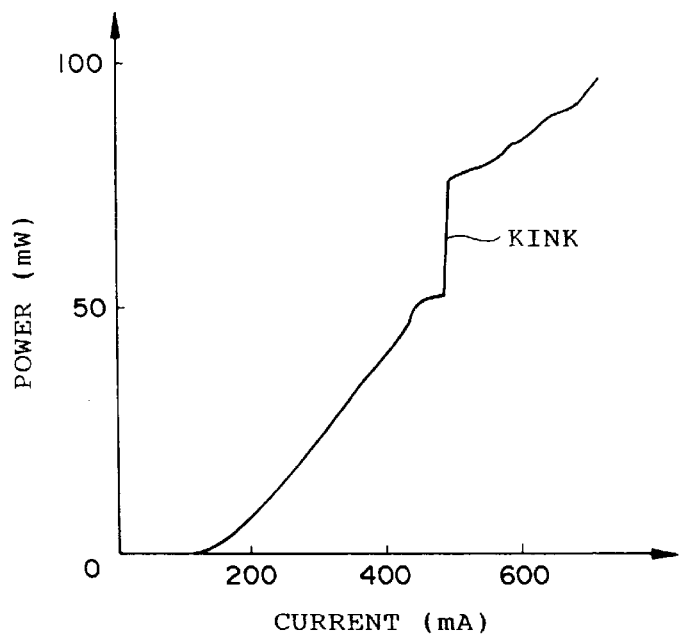
FIG. 3 a graph showing a relationship (electric current vs. optical output characteristic) of the output power to the injected electric current in the conventional light emitting device module.
Figure 4:
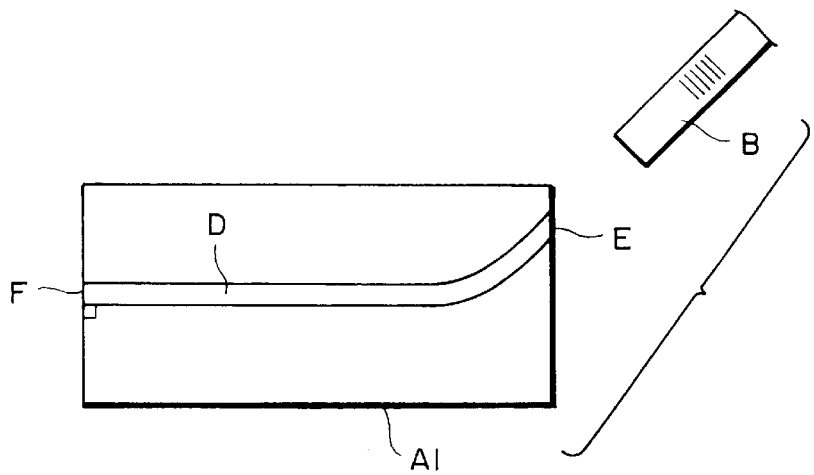
FIG. 4 a view showing a (first) schematic configuration of a semiconductor device (SLA: semiconductor laser amplifier) employed in the conventional light emitting device module.
Figure 5:
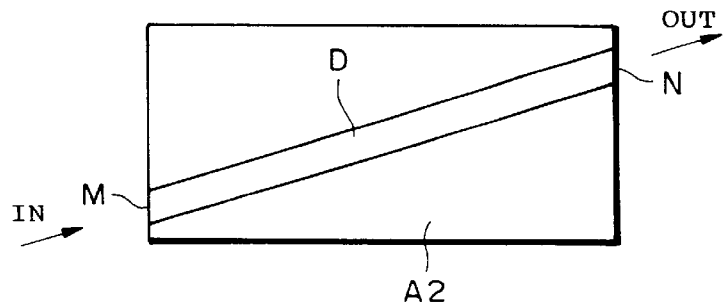
FIG. 5 is a view showing a (second) schematic configuration of a semiconductor device (SLA) employed in the conventional light emitting device module.

On the other hand, the light exit facet 13 is positioned at the other end of the active region 11. The light exit facet 13 is neither orthogonal to the direction in which the active region 11 extends (corresponding to the reference axis AX2) nor in parallel to the light reflecting facet 12. For example, as shown in FIGS. 6 and 7, the light exit facet 13 is slanted so as not to be orthogonal to the extending direction of the active region 11, while being in parallel to the stacking direction of the active region 11, cladding layer 15, and the like (vertical direction of the SLA 1). In this case, it is preferred that an angle $\theta_1$ at which the extending direction of the active region 11 and the light exit facet 13 intersect be 83° or less. When the angle $\theta_1$ is thus set, the resonance of light between the light reflecting facet 12 and the light exit facet 13 is sufficiently suppressed, thereby kink (see FIG. 3) can securely be prevented from occurring in the output characteristic of the light emitting device module.

In this embodiment, the light exit facet 13 is an end facet of the active region 11 which is exposed when a part of the SLA 1 is removed by dry-etching. For dry-etching, any of techniques such as reactive ion etching (RIE), reactive ion beam etching (RIBE), radical etching, and concentrated ion etching, which are used for making LSI, may be employed. The light exit facet 13 has a low light reflectivity (e.g., 0.01% or less), thereby transmitting therethrough the light propagating through the active region 11, without substantially reflecting it. In order to obtain a very low light reflectivity for the light exit facet 13, as shown in FIGS. 6 and 7, an anti-reflection coating 130 may be applied to its surface. As the anti-reflection coating 130, a dielectric multilayered film or the like is used.

Also, as shown in FIGS. 6 and 7, an electrode 16 is provided, along a stripe 190 formed in an insulating layer 19, on the upper face of the SLA 1, whose rear face is provided with the other electrode 17. Both electrodes 16 and 17 are used for injecting an electric current into the active region 11. Namely, as a predetermined voltage is applied to the electrodes 16 and 17, the electric current is injected into the active region 11.

Further, in this light emitting device module, an optical fiber 250 with a grating is arranged as being separated from the light exit facet 13. Together with the SLA 1, the optical fiber 250 is included in the light emitting device module. An end facet of the optical fiber 250 is optically coupled to the light exit facet 13 while light is not reflected therebetween. Specifically, the optical fiber 250 is arranged such that its optical axis AX1 is inclined with respect to the light exit facet 13 by a predetermined angle $\theta_2$ (e.g., about 18°). Disposed within the optical fiber 250 is a diffraction grating 21 for reflecting only light having a specific wavelength (reflection wavelength of the grating 21). The diffraction grating 21, which constitutes an external cavity together with the light reflecting facet 12 of the SLA 1, is formed such that the effective refractive index is periodically changed along the optical axis AX1 of the optical fiber 250. Here, a method of making the grating 21 is disclosed, for example, in International Publication No. WO 86/01303.

In the following, a method of making the SLA 1 will be explained.

Figure 8:
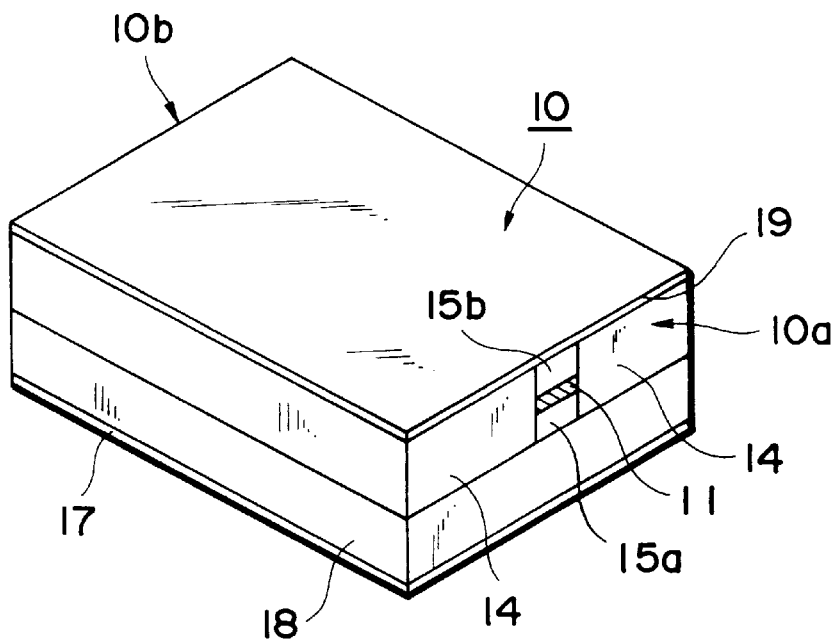
FIG. 8 is a perspective view for explaining a (first) part of a process for making the semiconductor device in the light emitting device module according to the present invention.
Figure 9:
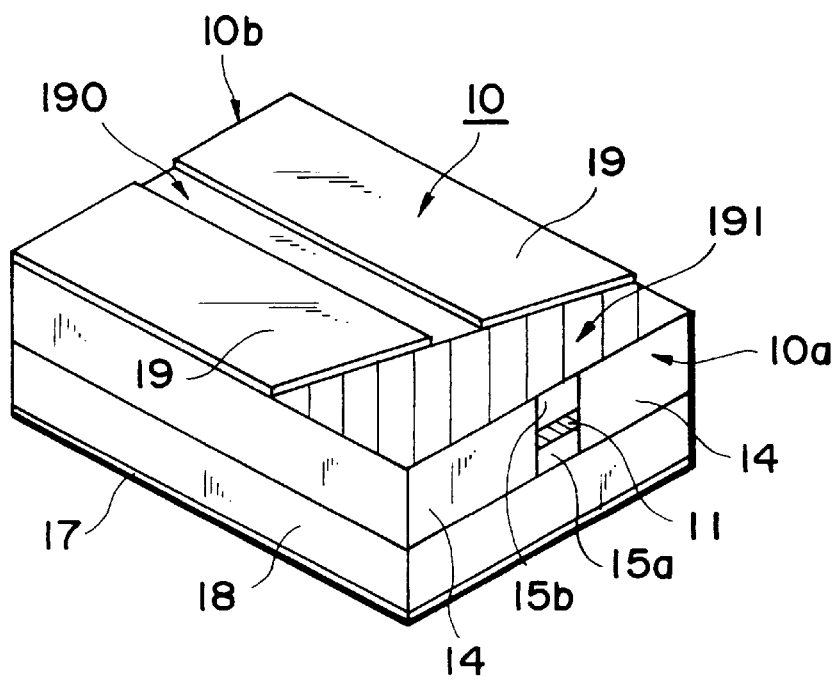
FIG. 9 is a perspective view for explaining a (second) part of the process for making the semiconductor device in the light emitting device module according to the present invention.

First, as shown in FIG. 8, a multilayered structure 10 comprising a plurality of laminated sheets of predetermined semiconductor materials is prepared. In order to prepare this multilayered structure 10, the cladding layer 15a, the active region 11, and the cladding layer 15b are successively growthed on the whole surface of the substrate 18; both side portions of thus formed laminate are removed so as to leave its center portion; and then the buried layers 14 are formed in place of the removed portions. Here, the upper surfaces of the buried layers 14 and cladding layer 15b are covered with the insulating layer 19, and the electrode 17 is provided on a rear surface of the substrate 18. Each layer of the multilayered structure 10 may be formed by crystal growth such as epitaxial growth. In the multilayered structure 10, side faces 10a and 10b exposing parts of the active region 11 and the like are in parallel to each other.

As the insulating layer 19, a SiO$_2$ film or the like is preferable, for example. Then, a part of the insulating layer 19 is removed so as to form a current injecting region (stripe 190). The dry-etching region 191 is an area which is defined by a boundary obliquely crossing at least the active region 11, namely, an area to be dry-etched in order to form an end facet (mirror surface) of the active region 11, i.e., light exit facet 13. The end facet of the active region 11 is exposed when the layers (the cladding layers 15a and 15b, active region 11, etc) below this area are removed Further, the boundary extends along a direction not orthogonal to the extending direction of the active region 11. For example, as indicated by hatches on the insulating layer 19 in FIG. 9, the dry-etching region is a trapezoidal area having one side not orthogonal to the reference axis of the active region 11. In order to remove a part of the insulating layer 19, a mask with a window corresponding to the current injecting region and the dry-etching region 191 is initially formed on the upper face of the insulating layer 19. Then, etching is performed so as to remove a part of the insulating layer 19 which is to become the current injecting region and the like.

Thereafter, the electrode 16 is formed at the portion of the insulating layer 19 where the current injecting region has been removed. Here, for the convenience of viewing, the electrode 16 is not depicted in FIG. 9. As shown in FIG. 6, it is important for the electrode 16 to be formed so as not to hang over the dry-etching region 191. Namely, it is necessary for the electrode 16 to be formed along the boundary of the dry-etching region 191 (hatched portion on the insulating layer 19 in FIG. 9) without extending to the dry-etching region 191, thereby preventing the dry-etching in the later step from being obstructed. Then, a mask for dry-etching is formed on the upper face of the multilayered structure 10. This mask is formed over the upper face of the multilayered structure 10 excluding the electrode 16 and dry-etching region 191.

After the mask for dry-etching is formed, dry-etching is performed so as to remove the part of the buried layers 14, part of the active region 11, and part of the cladding layers 15a and 15b positioned below the dry-etching region. Due to this etching step, the mirror surface of the active region 11, i.e., light exit facet 13, is formed so as to be inclined with respect to the extending direction of the active region 11 (direction along the reference axis AX2) by $\theta_1$. When the light exit facet 13 is thus formed by dry-etching, the light exit facet 13 not in parallel to the cleavage face 10b of the multilayered structure 10 including the light reflecting facet 12 can easily be formed (see FIGS. 10, 11A and 11B). Also, in order to lower the reflectivity of the light exit facet 13 with respect to the light transmitted through the inside and outside of the active region 11, the anti-reflection coating 130 made of a dielectric multilayered film or the like is applied to the light exit facet 13.

Thereafter, the high reflection coating 120 is applied to the surface of the light reflecting facet 12 positioned at the end of the active region 11 opposite to the light exit facet 13 by vapor deposition or the like in order to increase the light reflectivity of the light reflecting facet 12, thereby yielding the SLA 1.

Figure 12:
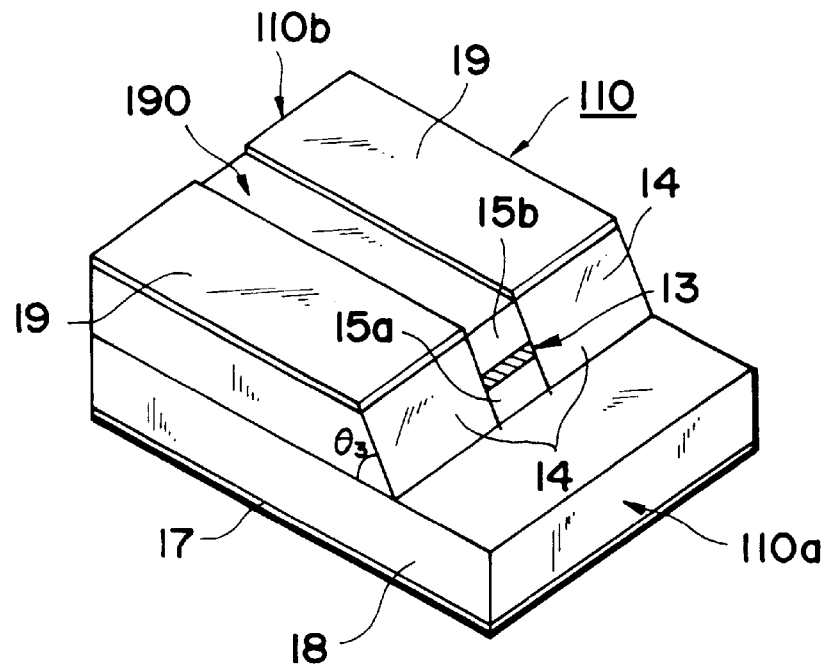
FIG. 12 is a perspective view showing a modified example of the semiconductor device in the light emitting device module according to the present invention.
Figure 13A:
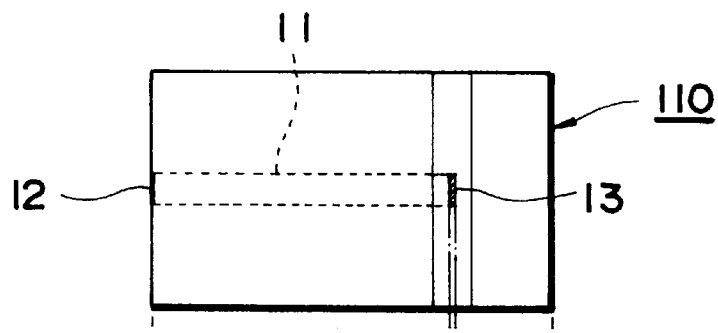
FIGS. 13A and 13B are plane and side views of the semiconductor device shown in FIG. 12.
Figure 13B:
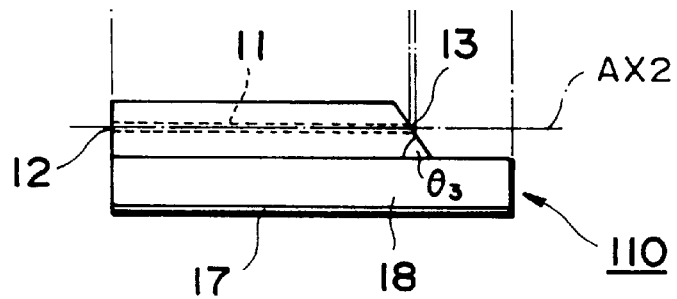

Alternatively, as shown in FIGS. 12, 13A and 13B, the dry-etching step may be performed such that the light exit facet 13 is inclined with respect to the main surface of the substrate 18 by a predetermined angle $\theta_3$. In this case, the light exit facet 13 can be inclined with respect to the light reflecting facet 12 (cleavage plane), which is orthogonal to the reference axis AX2 of the active region 11, by a predetermined angle (90°−$\theta_3$).

Namely, in the multilayered structure 10, the light exit facet 13 may not be in parallel to the stacking direction of the active region 11, cladding layers 15a and 15b, and the like, as long as it is neither orthogonal to the extending direction of the active region 11 (direction along the reference axis AX2) nor in parallel to the light reflecting facet 12. In a modified example of the first embodiment (FIGS. 7, 10, 11A and 11B), as shown in FIGS. 12, 13A and 13B, the light exit facet 13 is in parallel to the direction (width direction of the multilayered structure 10) orthogonal to the extending direction of the active region 11, while inclining with respect to the stacking direction of the active region 11 and the like by a predetermined angle $\theta_3$. A method of making this multilayered structure 110, as in the case of the multilayered structure 10 shown in FIGS. 10, 11A and 11B, comprises the steps of forming the insulating layer 19, partially removing the insulating layer 19, forming the electrode 16, and then partially dry-etching the layers. In an example of the dry-etching step, anisotropic etching with a medium degree of anisotropy (ratio of the etching speed of the vertical plane to that of the horizontal plane in the multilayered structure 110) and a small selection ratio (the ratio of etching speed of the active region 11, cladding layers 15a and 15b, and the like to the etching speed of the insulating layer 19) is used to remove a part of the active region 11, a part of the cladding layers 15a and 15b, and a part of the buried layers 14. The cross section of the active region 11 exposed by such etching, i.e., light exit facet 13, inclines with respect to the vertical direction of the main surface of the substrate 18, thereby also inclining with respect to the extending direction of the active region 11 by the predetermined angle $\theta_3$. For example, the angle $\theta_3$ is preferably 83° or less. When angle $\theta_3$ is thus set, the resonance of light between the light reflecting facet 12 and the light exit facet 13 is sufficiently suppressed, thereby kink (see FIG. 3) can securely be prevented from occurring in the output characteristic of the light emitting device module.

Figure 10:
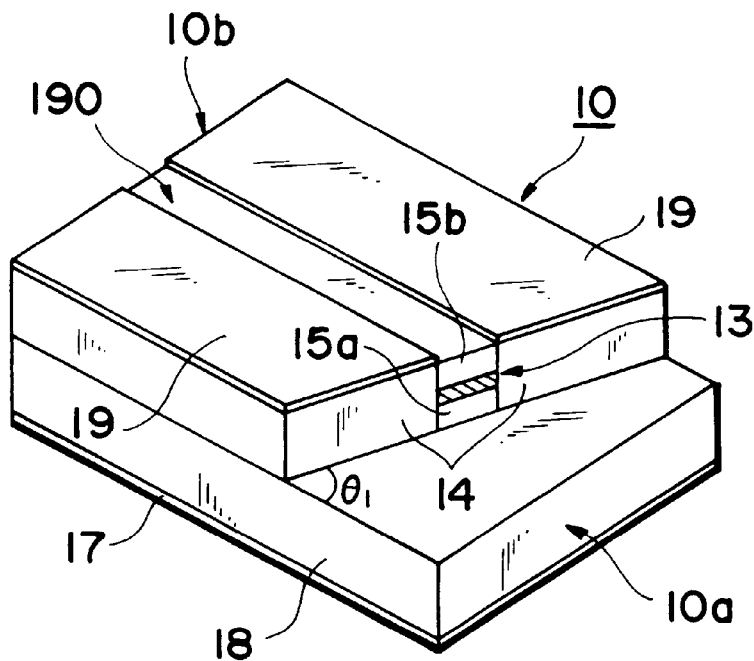
FIG. 10 is a perspective view for explaining a (third) part of the process for making the semiconductor device in the light emitting device module according to the present invention.
Figure 11A:
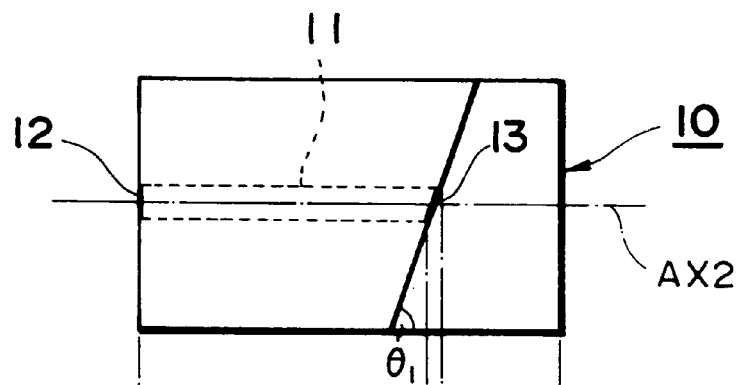
FIGS. 11A and 11B are plane and side views of the semiconductor device shown in FIG. 10.
Figure 11B:
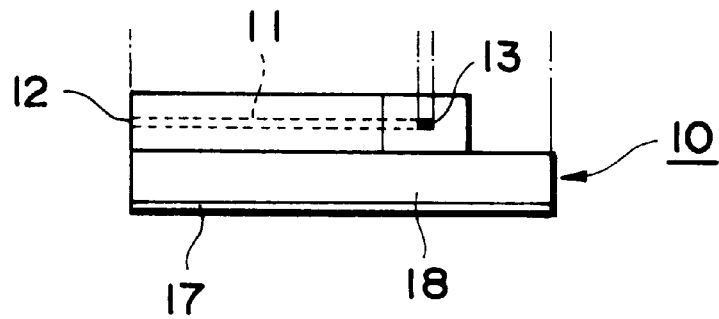

When thus configured multilayered structure 110 is used to manufacture an SLA, as in the case of the SLA 1 manufactured with the multilayered structure 10 shown in FIGS. 10, 11A and 11B, the light exit facet 13 neither in parallel to the light reflecting facet 12 nor orthogonal to the extending direction of the active region 11 can easily be formed. Also, when thus manufactured SLA 1 is used in the light emitting device module, the resonance between the light reflecting facet 12 and the light exit facet 13 is prevented from occurring, thereby kink (nonlinearity) does not occur in the injection current vs. optical output characteristic.

Figure 14:
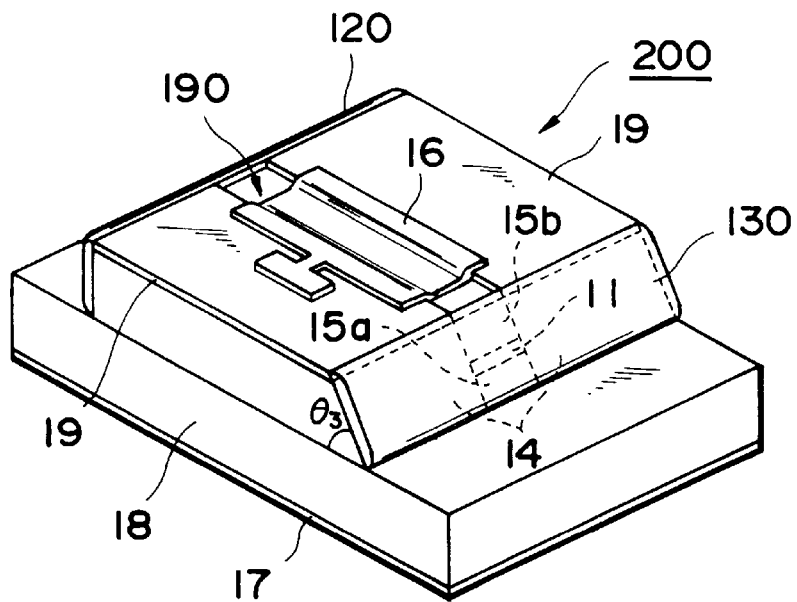
FIG. 14 is a perspective view showing a part of the configuration (configuration of the semiconductor device) of the light emitting device module according to a second embodiment of the present invention.
Figure 15:
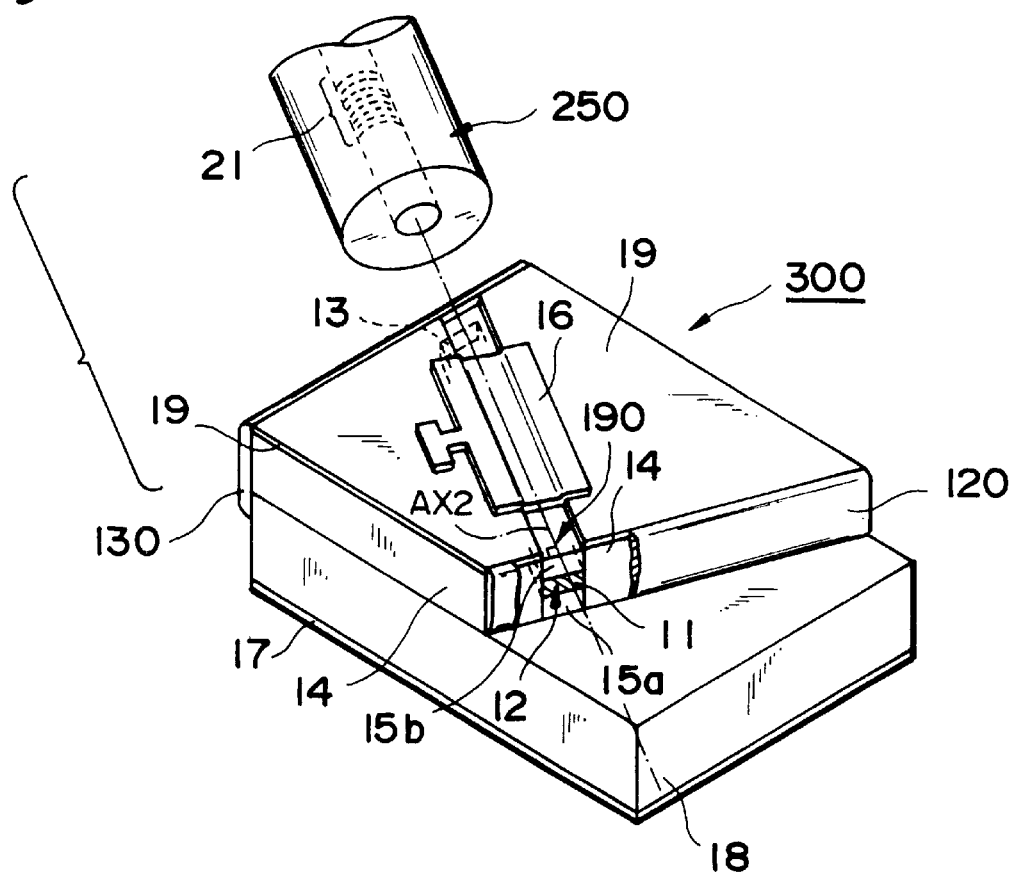
FIG. 15 is a perspective view showing a schematic configuration of the light emitting device module according to a third embodiment of the present invention.

As a second embodiment of the light emitting device module according to the present invention, an SLA 200 shown in FIG. 14 may be used. In the SLA 200 shown in FIG. 14, both of the light exit facet 13 and the light reflecting facet 12 are formed by dry-etching. Namely, the light reflecting facet 12 and the light exit facet 13 are not cleavage planes of the multilayered structure but mirror surfaces formed by dry-etching. Also, in the dry-etching step, the light reflecting facet 12 is formed in a direction orthogonal to the active region 11, while the light exit facet 13 is formed so as to incline with respect to the light reflecting facet 12. Accordingly, as in the case of the SLA according to the foregoing embodiment, when thus manufactured SLA 200 is used in the light emitting device module, the resonance between the light reflecting facet 12 and the light exit facet 13 is prevented from occurring, thereby kink (nonlinearity) does not occur in the injection current vs. optical output characteristic.

Here, in the SLA 200 shown in FIG. 14, as in the case of the SLA 1 shown in FIG. 6, the light exit facet 12 may be formed so as to incline with respect to the light reflecting facet 12 by the predetermined angle $\theta_1$.

In an SLA 300 which can be employed in a third embodiment of the light emitting device module according to the present invention, the light exit facet 13 of the multilayered structure is a cleavage plane, whereas the light reflecting facet 12 is a mirror surface formed by dry-etching. For example, in order to form the SLA 300 shown in FIG. 15, the active region 11 is made beforehand so as not to be orthogonal to a cleavage plane of a multilayered structure, this cleavage plane is utilized as the light exit facet 13, and the light reflecting facet 12 is formed by a dry-etching step so as to be orthogonal to the reference axis AX2 of the active region 11. In this process for making the SLA 300, a multilayered structure having the active region 11 formed in a direction not orthogonal to a cleavage plane is initially prepared, and then an exposed cross section of the active region 11 included in the cleavage plane in the multilayered structure is used as the light exit facet 13. Subsequently, as in the case of the above-mentioned SLA 1, the light reflecting facet 12 is obtained by the process comprising the steps of forming the insulating layer 19, partially removing the insulating layer 19, forming the electrode 16, and then partially dry-etching the layers. In the dry-etching step, it is important for the dry-etching region to be set such that the resulting mirror surface (light reflecting facet 12) is orthogonal to the reference axis AX2 of the active region 11.

In thus configured SLA 300, as in the case of the above-mentioned SLAs 1 and 200, the light exit facet 13 neither in parallel to the light reflecting facet 12 nor orthogonal to the extending direction of the active region 11 can easily be formed. When it is used in the light emitting device module, the resonance between the light reflecting facet 12 and the light exit facet 13 is prevented from occurring, thereby kink (nonlinearity) does not occur in the injection current vs. optical output characteristic.

In this manufacturing method, the SLA having the foregoing configurations can be obtained as well. Also, the light exit facet 13 and the light reflecting facet 12 not in parallel to each other can easily be formed.

In the following, the overall configuration of the light emitting device module according to the present invention will be explained.

Figure 16:
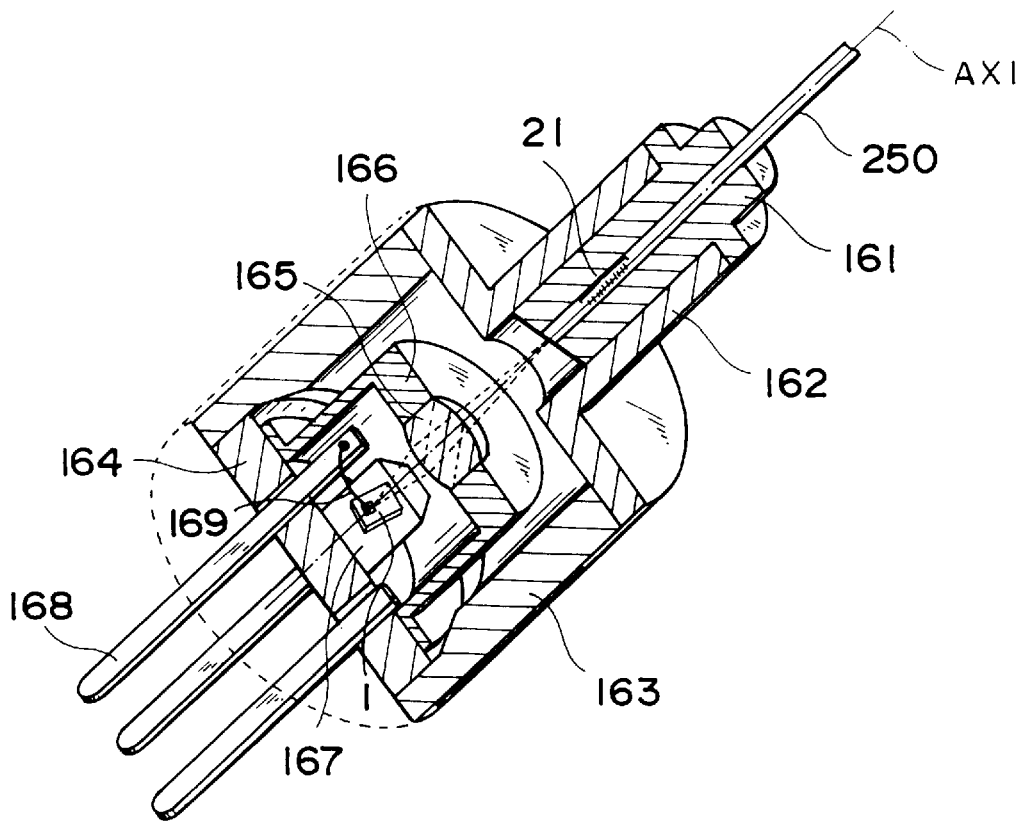
FIG. 16 is a cross-sectional view showing a specific configuration of the light emitting device module according to the present invention (first specific example), in which its structure for defining the positional relationship between the semiconductor device and the optical fiber with a grating is depicted in particular.
Figure 17:
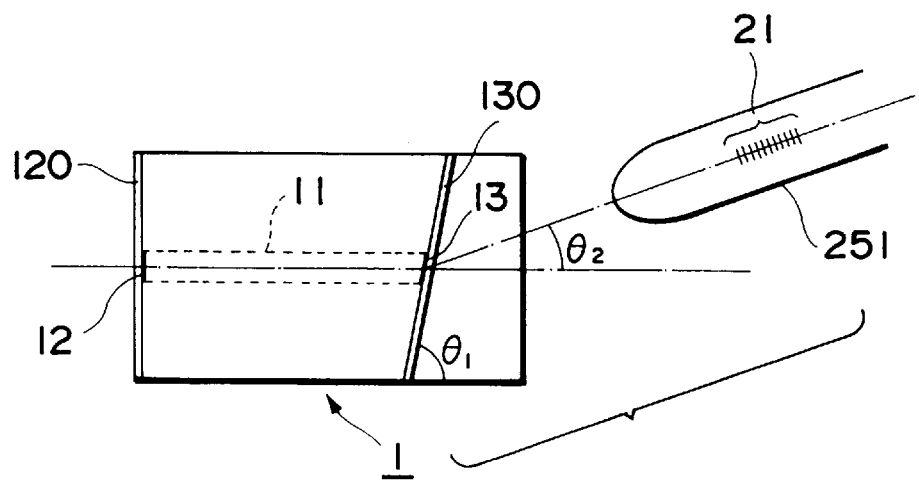
FIG. 17 is a cross-sectional view showing a specific configuration of the light emitting device module according to the present invention (second specific example)

As shown in FIGS. 16, 18A and 18B, the optical fiber 250 is disposed at a position spaced from the SLA 1 by a predetermined distance, thereby yielding a light emitting device module. For example, the SLA is installed within a hermetically sealed package, and the optical fiber 250 is secured to the package by way of a ferrule 161 or the like, thereby the light emitting device module is assembled such that the light exit facet 13 of the SLA 1 and an end facet of the optical fiber 250 oppose each other. Also, it is preferred that a predetermined lens system be disposed between the light exit facet 13 of the SLA 1 and the end facet of the optical fiber 250 in order to increase the optical coupling efficiency therebetween.

The package shown in FIG. 16 is constituted by a sleeve 162 holding the ferrule 161, a housing 163, and a stem 164 through which a lead pin 168 penetrates. The SLA 1 is held on a holder 167 secured to the stem 164 and is electrically connected to the lead pin 168 by way of a wire 169. Accommodated within the package is a lens holder 166 for holding a lens 165 which is to be disposed between the SLA 1 and the optical fiber 250.

On the other hand, the package shown in FIG. 18 is constituted by a housing 263 and a sleeve 262 for holding a ferrule 261 attached to a tip of the optical fiber 250. The SLA 1 is accommodated within the SLA 1 and is secured to a predetermined position by way of a holder 264. Lead pins 267 are electrically connected to their corresponding electrodes. Also in the light emitting device module shown in FIGS. 18A and 18B, a lens holder 265 is accommodated within a package, which holds a lens 266 to be disposed between the SLA 1 and the optical fiber 250.

In this state, a voltage is applied between the electrodes 16 and 17 of the SLA 1, thereby injecting a predetermined electric current into the SLA 1. Consequently, amplified spontaneous emission (ASE) is yielded. While generating stimulated emission, the spontaneously emitted light propagates through the active region 11 together with the stimulatingly emitted light, so as to be reflected by the light reflecting facet 12 having a high reflectivity and then outputted from the light exit facet 13 having a low reflectivity. In this case, though a part of the light to be transmitted through the light exit facet 13 is reflected thereby, thus reflected light does not resonate between the light exit facet 13 and the light reflecting facet 12 since they are not in parallel to each other.

Here, when no optical material is disposed in the optical path between the SLA 1 and the optical fiber 250, an optical fiber 251 having a grating and a lensed fiber (rounded-end fiber) with a curved end facet, in which the grating 21 is formed in a core region, may be disposed so as to incline with respect to the light exit facet 13 by a predetermined angle $\theta_2$.

The light outputted from the light exit facet 13 enters the optical fiber 250 and propagates therethrough along the core of the optical fiber, and a part of this light (light having a wavelength coinciding with the reflection wavelength of the grating 21) is reflected toward the SLA 1 by the diffraction grating 21 in the optical fiber 250. Namely, only the light in a predetermined wavelength band determined by the pitch of the diffraction grating 21 is reflected toward the SLA 1. The light reflected by the diffraction grating 21 is emitted from the end facet of the optical fiber 250 so as enter the active region 11 by way of the light exit facet 13 of the SLA 1. Thus obtained light propagating through the active region 11 is reflected by the light reflecting facet 12 while being amplified again. In this manner, the light (having a wavelength coinciding with the reflection wavelength of the grating 21) is repeatedly travels to-and-fro between the light reflecting facet 12 and the diffraction grating 21 in the optical fiber 250 so as to be amplified, and then a part of thus amplified light is transmitted through the diffraction grating 21 and propagates through the optical fiber 250 so as to be outputted as a laser beam having a desired wavelength.

Thus, as the light exit facet 13 is formed not in parallel to the light reflecting facet 12 in the SLA 1, the light is kept from resonating therebetween, thereby unnecessary laser beams other than the laser beam having a desired wavelength can be prevented from being outputted. Accordingly, even when the electric current injected into the SLA 1 is increased so as to yield a higher laser output, since the oscillation state of the laser beam with a desired wavelength is stable, kink (nonlinearity) does not occur in its injection current vs. optical output characteristic.

As explained in the foregoing, according to the present invention, as the light exit facet is neither orthogonal to the extending direction of the active region nor in parallel to the light reflecting facet, unnecessary light is prevented from resonating between the light exit facet and the light reflecting facet. Consequently, when they are combined with an optical fiber provided with a diffraction grating so as to form a light emitting device module, kink (nonlinearity) can be prevented from occurring in the injection current vs. optical output characteristic of the laser beam outputted therefrom, allowing a favorable output characteristic to be obtained.

When at least one of the light exit facet and light reflecting facet is formed by dry-etching, they can be formed with any angle therebetween. Consequently, the angle between the light exit facet and the light reflecting facet may be appropriately set so as to prevent light from resonating therebetween.

In addition, when a low reflecting film (anti-reflection coating) is attached to the light exit facet, the reflection of light in the latter can be lowered. Accordingly, the resonance of light between the light exit facet and the light reflecting facet can further be suppressed.

Also, when a high reflecting film (high reflection coating) is attached to the light reflecting facet, the reflection of light in the latter can be increased. Accordingly, when combined with an optical fiber with a grating to form a light emitting device module, the output of the laser beam can be increased, allowing a stable laser output to be obtained.

Further, when at least one of both ends of the active region is dry-etched to expose at least one end facet (mirror surface) so as to be used as at least one of the light exit facet and light reflecting facet, the light exit facet and light reflecting facet not in parallel to each other can easily be formed regardless of cleavage planes.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 8-158464 (158464/1996) filed on Jun. 19, 1996 hereby incorporated by reference.

What is claimed is:

1. A light emitting device module comprising:
   (1) a semiconductor device having:
      an active region capable of amplifying light having a predetermined wavelength, said active region extending along a predetermined reference axis,
      a light reflecting facet, positioned at a first end of said active region, for reflecting light propagating through said active region, said light reflecting facet being arranged so as to be orthogonal to said reference axis of said active region, and
      a light exit facet, positioned at a second end of said active region opposing said first end, for outputting the light propagating through said active region from said semiconductor device, said light exit facet inclining with respect to said light reflecting facet by a predetermined angle; wherein said light exit facet is arranged so as to be neither orthogonal to said reference axis of said active region nor in parallel to said light reflecting facet;
   (2) an optical fiber having an end facet arranged so as to face said light exit facet of said semiconductor device, said optical fiber having:
      a core region having a predetermined refractive index,
      a cladding region provided around an outer periphery of said core region, said cladding region having a lower refractive index than said core region, and
      a grating provided along a longitudinal direction of said core region, said grating constituting a resonator together with said light reflecting facet of said active region in said semiconductor device; and
   (3) a structure for respectively holding said semiconductor device and said optical fiber at predetermined positions such that an optical axis of said optical fiber and said reference axis of said active region in said semiconductor device intersect at a predetermined angle other than zero and 180 degrees.

2. A light emitting device module according to claim 1, further comprising an optical system arranged in an optical path between said light exit facet of said active region in said semiconductor device and said end facet of said optical fiber.

3. A light emitting device module according to claim 1, wherein said optical fiber has an end facet facing said light exit facet of said active region, said end facet of said optical fiber being curved.

4. A light emitting device module according to claim 1, wherein at least one of said light reflecting facet and light exit facet of said active region in said semiconductor device is a surface formed by dry-etching.

5. A light emitting device module comprising:
   (1) a semiconductor device having:
      an active region capable of amplifying light having a predetermined wavelength, said active region extending along a predetermined reference axis,
      a light reflecting facet, positioned at a first end of said active region, for reflecting light propagating through said active region, said light reflecting facet is arranged so as to be orthogonal to said reference axis of said active region, and
      a light exit facet, positioned at a second end of said active region opposing said first end, for outputting the light propagating through said active region from said semiconductor device, said light exit facet being inclined with respect to said light reflecting fact by a predetermined angle; wherein said light exit facet is arranged so as to be neither orthogonal to said reference axis of said active region nor in parallel to said light reflecting facet;
      a first film, covering said light exit facet of said active region in said semiconductor device, for reducing a light reflectivity of said light exit facet;
      a second film, covering said light reflecting facet of said active region in said semiconductor device, for increasing the light reflectivity of said light reflecting facet;
   (2) an optical fiber having an end fact arranged so as to face said light exit facet of said semiconductor device, said optical fiber having:
      a core region having a predetermined refractive index,
      a cladding region provided around an outer periphery of said core region, said cladding region having a lower refractive index than said core region, and
      a grating provided along a longitudinal direction of said core region, said grating constituting a resonator together with said light reflecting facet of said active region in said semiconductor device; and
   (3) a structure for respectively holding said semiconductor device and said optical fiber at predetermined positions such that an optical axis of said optical fiber and said reference axis of said active region in said semiconductor device intersect at a predetermined angle other than zero and 180 degrees.

6. A light emitting device module according to claim 5, wherein said semiconductor device is a semiconductor laser amplifier; and wherein said light exit facet of said active region has a lower light reflectivity than said light reflecting facet of said active region.

7. A light emitting device module according to claim 5, wherein said first film includes an antireflection coating, and said second film includes a high reflection coating.

8. A method of making a light emitting device module, comprising the steps of:

(1) preparing an optical fiber having a grating;

(2) making a semiconductor device in accordance with the steps of:

preparing a semiconductor laminate having an active region capable of amplifying light with a predetermined wavelength, said active region extending along a predetermined reference axis and having a first tip portion and a second tip portion opposing said first tip portion each including a cleavage plane;

dry-etching at least one of said first and second tip portions of said active region so as to form at least one of said light reflecting facet of said active region included in said first tip portion and said light exit facet of said active region included in said second tip portion, said light exit fact being inclined by a predetermined angle with respect to said light reflecting facet of said active region;

forming a first film, on a surface of said light reflecting facet of said active region for increasing a light reflectivity of said light reflecting facet; and forming a second film, on a surface of said light exit facet of said active region, for reducing a light reflectivity of said light exit facet; and (3) arranging said semiconductor device and said optical fiber such that an optical axis of said optical fiber and said reference axis of said active region in said semiconductor device intersect at a predetermined angle other than zero and 180 degrees.

9. A method according to claim 8, wherein at least one of said first and second tip portions of said active region is dry-etched such that said light reflecting facet is orthogonal to said reference axis of said active region and said light exit facet is neither orthogonal to the reference axis of said active region nor in parallel to said light reflecting facet.

* * * * *